(12) United States Patent
Maier et al.

(10) Patent No.: US 12,305,270 B2
(45) Date of Patent: May 20, 2025

(54) METHOD FOR PRODUCING A COATING

(71) Applicant: Oerlikon Surface Solutions AG, Pfäffikon, Pfäffikon (CH)

(72) Inventors: Mathias Maier, Owingen (DE); Othmar Zueger, Triesen (LI)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 331 days.

(21) Appl. No.: 17/775,437

(22) PCT Filed: Nov. 6, 2020

(86) PCT No.: PCT/EP2020/081379
§ 371 (c)(1),
(2) Date: May 9, 2022

(87) PCT Pub. No.: WO2021/089842
PCT Pub. Date: May 14, 2021

(65) Prior Publication Data
US 2022/0389560 A1 Dec. 8, 2022

Related U.S. Application Data

(60) Provisional application No. 62/931,922, filed on Nov. 7, 2019.

(51) Int. Cl.
*C23C 14/02* (2006.01)
*C23C 14/00* (2006.01)
(Continued)

(52) U.S. Cl.
CPC ........ *C23C 14/0015* (2013.01); *C23C 14/025* (2013.01); *C23C 14/14* (2013.01);
(Continued)

(58) Field of Classification Search
CPC ....... C23C 14/025; C23C 14/14; C23C 16/30; C23C 16/22
See application file for complete search history.

(56) References Cited

U.S. PATENT DOCUMENTS 4,051,297 A 9/1977 Veigel
4,388,344 A 6/1983 Shuskus et al.
(Continued)

FOREIGN PATENT DOCUMENTS

CA 1089798 11/1980
CN 101802248 8/2010
(Continued)

OTHER PUBLICATIONS

Walters, Glen, et al., "Tiered deposition of sub-5 nm ferroelectric Hf1—xZrxO2 films on metal and semiconductor substrates". Applied Physics Letters 112, 192901 (2008), pp. 1-5.*
(Continued)

*Primary Examiner* — Bret P Chen
(74) *Attorney, Agent, or Firm* — Thorpe North & Western, LLP

(57) ABSTRACT

A method of forming a coating for deposition to non-metallic surfaces comprises the steps of applying (120) a semiconductor material to a substrate to form a semiconductor material layer and simultaneously or subsequently applying (140) metallic material or additional semiconductor material. The metallic material or additional semiconductor material is introduced into the semiconductor material layer in a targeted manner to tailor the optical properties of the coating.

19 Claims, 7 Drawing Sheets

Figure 1B:
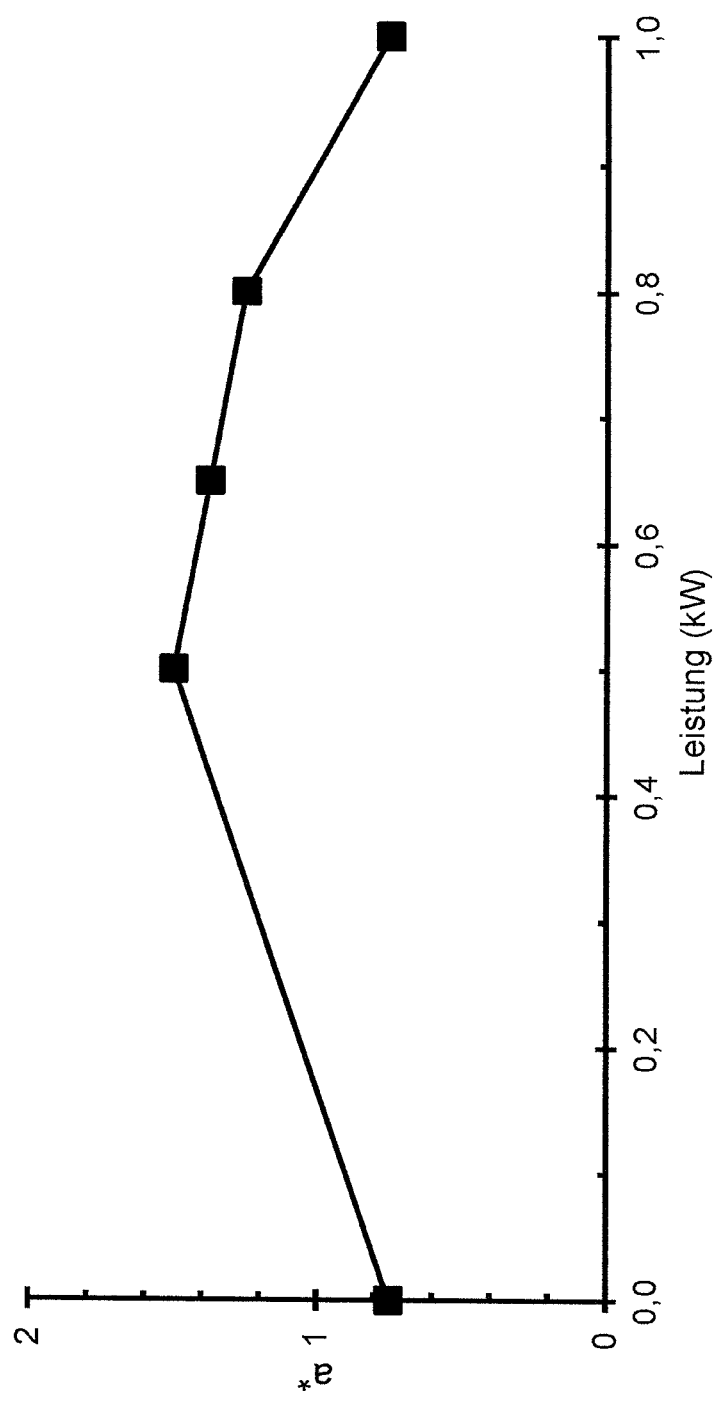

(51) Int. Cl.
*C23C 14/14* (2006.01)
*C23C 16/00* (2006.01)
*C23C 16/30* (2006.01)
*C23C 28/00* (2006.01)

(52) U.S. Cl.
CPC ............ *C23C 16/006* (2013.01); *C23C 16/30* (2013.01); *C23C 28/321* (2013.01)

(56) References Cited

U.S. PATENT DOCUMENTS

| | | | |
|---|---|---|---|
| 5,535,056 | A | 7/1996 | Caskey et al. |
| 7,033,679 | B2 | 4/2006 | Okura et al. |
| 8,137,465 | B1 * | 3/2012 | Shrinivasan ...... H01L 21/67115 |
| | | | 156/345.31 |
| 9,114,760 | B2 | 8/2015 | Mayer Pujadas |
| 9,187,820 | B2 | 11/2015 | Kawaguchi et al. |
| 2002/0125130 | A1 | 9/2002 | Finley |
| 2006/0091451 | A1 * | 5/2006 | Yamaguchi ....... H01L 21/76802 |
| | | | 257/316 |
| 2006/0105196 | A1 | 5/2006 | Roth et al. |
| 2007/0051975 | A1 | 3/2007 | Figuet et al. |
| 2017/0015802 | A1 | 1/2017 | Hall et al. |

FOREIGN PATENT DOCUMENTS

| | | | | |
|---|---|---|---|---|
| CN | 103328264 | | 9/2013 | |
| DE | 11 208 002496 | B4 | 10/2019 | |
| DE | 11 2008 002496 | B4 | 10/2019 | |
| EP | 0234593 | | 9/1987 | |
| EP | 0581280 | B1 * | 10/1999 | ............... G03F 7/20 |
| EP | 2 640 609 | B1 | 11/2016 | |
| JP | 2000192245 | | 7/2000 | |
| JP | 2002173339 | | 6/2002 | |
| JP | 2002220657 | | 8/2002 | |
| JP | 2010188713 | | 9/2010 | |
| JP | WO 2012/122787 | A1 * | 9/2012 | ............. H01L 21/02 |
| JP | 5072147 | * | 11/2012 | ........... H01L 21/336 |
| KR | 19990048881 | | 7/1999 | |
| KR | 10-2018-0102094 | * | 9/2018 | ............. C23C 14/08 |
| KR | 2019-0052825 | A | 5/2019 | |
| WO | WO 2010/108894 | * | 9/2010 | ............. H01L 51/52 |
| WO | WO 2012/066417 | A1 | 5/2012 | |
| WO | WO 2014/089783 | A1 * | 6/2014 | ........... H01L 21/336 |
| WO | 2021018422 | | 2/2021 | |

OTHER PUBLICATIONS

Mielczarski, Jerzy A., "External Reflection Infrared Spectroscopy at Metallic, Semiconductor, and Nonmetallic Substrates. 1. Monolayer Films". J. Phys. Chem. 1993, 97, 2649-2663.*

Lee, Sang Woon, et al., "Influences of metal, non-metal precursors, and substrates on atomic layer deposition processes for the growth of selected functional electronic materials". Coordination Chemistry Reviews, 257 (2013) 3154-3176.*

Mattinen, Miika, et al., "Atomic Layer Deposition of Emerging 2D Semiconductors, HfS2 and ZrS2, for Optoelectronics". Chemistry of Materials, 2019, 31, 5713-5724.*

Khachfe, Refahi Abou, et al., "Backside Absorbing Layer Microscopy: A universal relationship between physical thickness and reflectivity". Optics Express, 2019, 28 (4) pp. 4836-4844.*

Bouabellou A et al. "Silicidation in chromium-amorphous silicon multilayer films," Thin Solid Films, Feb. 15, 2001, vol. 383, NR.: 1-2, pp. 296-298, Elsevier, Amsterdam, NL, https://dx.doi.org/10.1016/S0040-6090(00)01572-8.

Written Opinion for International Application Serial No. PCT/EP20/081379 dated Feb. 18, 2021, 5 pages, Europe.

* cited by examiner

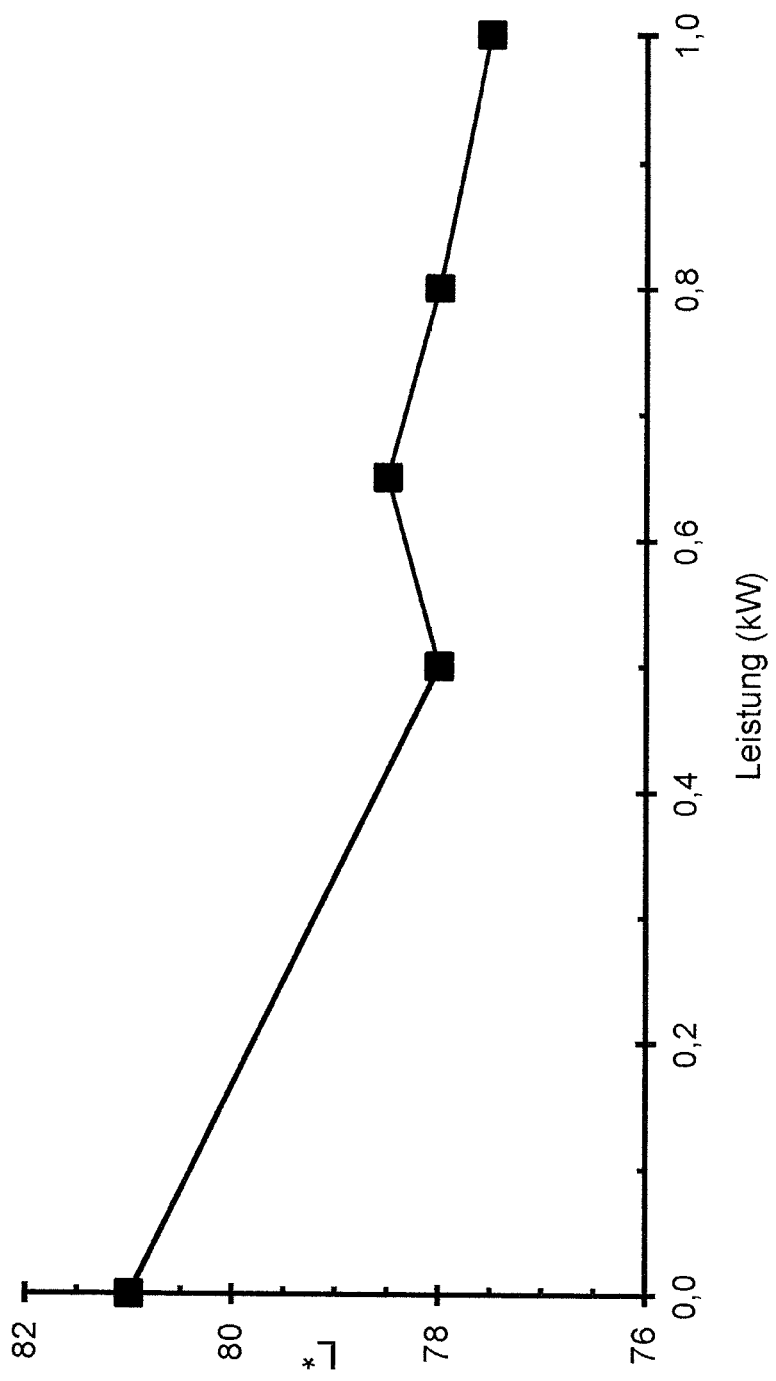

METHOD FOR PRODUCING A COATING

The present invention relates to a method for preparing a coating for the deposition to non-metallic surfaces and to a coating for the deposition to non-metallic surfaces.

Non-metallic surfaces, such as the surfaces of components made of plastics, are nowadays frequently coated with metallic thin-film coatings to change their appearance and/or to achieve other desired coating properties.

A desired metallic appearance of a component can be achieved, for example, with thin layers of a selected metal whose thicknesses need not exceed about 10 to 100 nm to make them indistinguishable in appearance from full-metal components. Such metal layers can be applied using vacuum coating processes such as evaporation or sputtering, among others.

However, most metal coatings have low transparency in large parts of the electromagnetic spectrum, which makes them unsuitable for some applications. For example, metal coatings strongly absorb or reflect electromagnetic waves in frequency ranges between 76 and 77 GHz, which are of interest for use in radar techniques, making metal coatings unsuitable for such applications due to their low transmittance in these ranges.

It has been known for some time that such a desired metallic appearance can also be achieved with semiconducting thin films, whereby these films are largely transparent to electromagnetic waves due to their semiconducting properties and can therefore also be used, for example, for radar techniques, capacitive sensors or the like. The metallic appearance of such layers results here from the high refractive index n in the optical range, which leads to high reflection even with very thin layers. The use of semiconductor materials also has the advantage that the external color appearance has a low dependence on the viewing angle, which is also the case when natural metal layers are used.

By choosing a suitable layer thickness and/or using a "thick" multilayer coating system, it is possible to achieve a certain range of metallic-looking, non-gray shades.

However, disadvantageously, the metallic-looking colors that can be achieved in this way are limited to a narrow range of color coordinates (e.g. CIE L*a*b*). In addition, the use of thin optical interference layers of semiconductor materials to produce a metallic appearance has the disadvantage of large differences between reflection minima and maxima due to the high refractive index and low absorption in the optical region. This in turn causes an undesirable "garish" color perception.

It is therefore an object of the present invention to at least partially overcome the above-mentioned disadvantages of known coatings and processes for their production. In particular, it is the object of the invention to provide a coating that has an appealing external appearance largely independent of the viewing angle and can be used in a variety of ways, in particular also in the radar range.

The above object is solved by a method with the features of the independent method claim and a coating according to claim 13. Further features and details of the invention result from the respective dependent claims, the description and the drawings. Features and details described in connection with the method according to the invention naturally also apply in connection with the coating according to the invention and vice versa in each case, so that reference is or can always be made mutually with regard to the disclosure of the individual aspects of the invention.

Here, the method according to the invention comprises the stages/steps of applying a semiconductor material to a substrate to form a semiconductor material layer and simultaneously or subsequently applying metallic material or additional semiconductor material, wherein the metallic material or the additional semiconductor material is introduced into the semiconductor material layer in a targeted manner to adapt the optical properties of the coating.

A semiconductor material is preferably understood to be a material consisting of semiconductor elements or semiconductor compounds, which in particular has an electrical conductivity between $10^4$ S/cm and $10^{-8}$ S/cm. In this context, an additional semiconductor material is preferably understood to mean a semiconductor material different from the semiconductor material for the formation of a semiconductor material layer, which is preferably introduced only for doping. According to the invention, a metal is preferably understood to mean a material consisting of elementary metals. In the context of the invention, a substrate is understood to mean in particular a base or a foundation for a coating, for example a display, a car body or the like. A targeted introduction of a metallic material into a semiconductor material layer may comprise, for the present, in particular the selection of the amount of the metallic material to be applied and/or the deposition area (application area) of the metallic material to be applied. The optical properties may further comprise, in particular, the absolute and/or relative reflectivity of the coating as a function of wavelength in the optical domain. Likewise, the optical properties may involve transparency in other frequency ranges of the electromagnetic spectrum, such as, in the radar range at 76 and 77 GHz, or may involve viewing angle dependence of the external appearance.

In order to be able to adjust the optical properties of a coating as specifically as possible, it can be advantageously provided that the semiconductor material is added in the form of a pure substance, the semiconductor material preferably being formed from silicon or germanium or selenium or gallium arsenide. With regard to increasing the flexibility with respect to the adaptation of the optical properties of a coating, in particular the adaptation of different optical properties of a coating, it may further be advantageous if the semiconductor material is present as a mixture of different semiconductor materials, wherein the semiconductor materials may preferably comprise silicon and/or germanium and/or selenium and/or gallium arsenide.

Likewise, with regard to the most targeted possible adaptation of the optical properties of a coating, it can be provided that the metallic material is added in the form of a pure substance, the metallic material preferably being formed from chromium or molybdenum or aluminum or zirconium. Moreover, with a view to increasing flexibility with regard to adaptation of the optical properties of the coating, it may be equally advantageous if the metallic material is present as a mixture of different metals, which metals may preferably comprise chromium and/or molybdenum and/or aluminum and/or zirconium.

With regard to a particularly effective and targeted adaptation of the optical properties of a coating, it can be further provided that the metallic material to be applied and/or the quantity of the metallic material to be applied and/or the deposition area of the metallic material to be applied is selected at least partly on the basis of the absorption coefficient k of the metallic material in the optical area. In this context, it has been recognized within the scope of the invention that in particular the differences between reflection minima and reflection maxima of a coating are responsible for an undesired "glaring" external appearance. Moreover, it has been recognized in the context of the invention that metals with a high absorption coefficient k effectively minimize the differences between reflection minima and reflection maxima of a coating that are responsible for the undesirable "glaring" external appearance. This is possible in particular because after light rays enter the coating layer at the first interface of the coating layer due to the increased absorption of the coating layer (in the optical region), the reflection of the light rays at the second interface of the coating layer is significantly lower, which consequently reduces the destructive and constructive interference of the light rays reflected at the first and second interfaces of the coating layer and thus effectively minimizes the differences between reflection minima and reflection maxima of the coating. In particular, this results in preferred "softer" (lower contrast) color transitions. In the context of the invention, the optical range is understood to mean in particular the optical frequency range of the electromagnetic spectrum of light in a range of approximately 350-750 nm. It is also conceivable, moreover, that the selection of the metallic material to be applied and/or the selection of the amount of the metallic material to be applied and/or the selection of the deposition area of the metallic material to be applied is based at least in part on the electrical conductivity of the metallic material in the optical range, because this is related at least in part to the absorption coefficient k. Furthermore, it is additionally advantageous to make the selection of the metallic material to be applied and/or the selection of the amount of the metallic material to be applied and/or the selection of the deposition area of the metallic material to be applied at least partially dependent with respect to the semiconductor material used, in particular with respect to the refractive index n of the semiconductor material used in the optical area.

Within the scope of a constructively simple possibility of the most sensitive possible dosing during the deposition/application of the layer materials, it can be advantageously provided that the deposition of the semiconductor material and/or the deposition of the metallic material is carried out by means of a thermal treatment, the thermal treatment preferably being carried out at a temperature of more than 400° C., in particular at a temperature of more than 800° C. Alternatively, the "doping" could, for example, already be set on the "target".

In particular, it is conceivable that the amount of metallic material applied and/or the proportion of metallic material applied in relation to the sum of semiconductor material and metallic material is adjusted by varying the treatment time and/or the treatment temperature. Such an adjustment of the amount or the proportion of material to be applied is particularly advantageous in coating processes under vacuum conditions, because a variation of the treatment temperature and treatment time can be controlled in a simple manner from outside, outside a coating chamber.

Within the framework of a structurally simple and yet flexible and sensitively adjustable deposition of the coating materials, it can be advantageously provided in particular according to the invention that the deposition of the semiconductor material to the substrate takes place at least partially simultaneously with the deposition of a portion of metallic material, wherein the semiconductor material to be applied and the metal to be applied are preferably premixed and/or mixed together during the deposition. Thus, in the context of a simultaneous deposition of the semiconductor material and the metallic material, for example, when using a sputtering process for the deposition of the coating, either a semiconductor target alloyed with a suitable metal, such as a silicon target alloyed with chromium, can be used or the metallic material (for example chromium) and the semiconductor material (for example silicon) can be applied from different targets in the context of a co-sputtering process. Similarly, when using an evaporation process to apply the coating in a crucible or the like, a premixed material or alloy of metallic material and semiconductor material could already be used, or the materials could be separately evaporated at least partially simultaneously from two crucibles.

With regard to the possible deposition processes, it is further conceivable that the deposition of the semiconductor material and the metallic material is carried out via a chemical and/or physical deposition process, preferably a chemical vapor deposition (CVD) process and/or a physical vapor deposition (PVD) process, in particular via a plasma-assisted chemical vapor deposition process (PA-CVD process) and/or a high-intensity pulse magnetron sputtering (HIPIMS) and/or a cathodic arc deposition process and/or an electron beam-assisted physical vapor deposition process (EBPVD-process).

Furthermore, in order to modify the deposition conditions, it is conceivable, in particular in the case of deposition processes with ionization steps, that a negative bias voltage is applied to the substrate to be coated during deposition of the semiconductor material (for example, when a DC voltage is used), the negative bias voltage being less than 200 V, preferably less than 150 V, in particular less than 100 V. Alternatively, of course, the use of an alternating voltage is also conceivable.

In addition, in the context of a controllable deposition of coating materials, it is conceivable that a shielding gas is used when applying the semiconductor material, the shielding gas preferably being formed in the form of nitrogen and/or argon.

In order to achieve improved adhesion of the coating material to the substrate, it can be further provided that, prior to deposition of a semiconductor material to a substrate, a pretreatment of the substrate surface is carried out in order to bring about stronger adhesion of the semiconductor material layer to the substrate, wherein the pretreatment can comprise in particular the deposition of an adhesive layer to the substrate surface, wherein the adhesive layer can be formed in particular in the form of a lacquer layer.

In order to integrate improved protection or additional properties into the coating in question, it can be advantageously further provided that after a deposition of a semiconductor material and a simultaneous or subsequent deposition of metallic material, a final deposition of a protective layer takes place, the protective layer being formed in particular in the form of a lacquer layer.

Another object of the invention is a coating for a deposition to non-metallic surfaces, in particular producible by a method described above. Here, the coating comprises a semiconductor material layer with a portion of metallic material or additional semiconductor material integrated within the semiconductor material layer. Thus, the coating according to the invention has the same advantages as have already been described in detail with respect to the method according to the invention.

In the context of forming the thinnest possible coating thicknesses, it can be provided in particular that the coating is formed in the form of a monolayer. A low layer thickness can be advantageous here not only for reasons of saving coating material but also for reasons of saving process time for applying the coating.

In the context of forming the thinnest possible layer thicknesses, it is particularly conceivable here that the coating has a layer thickness of less than 120 nm, preferably a layer thickness of less than 100 nm, in particular a layer thickness of less than 80 nm.

With regard to the simultaneous guarantee of a minimum layer thickness to ensure the necessary robustness, it is further conceivable that the coating has a layer thickness between 20 and 120 nm, preferably a layer thickness between 40 and 100 nm, in particular a layer thickness between 50 and 60 nm.

In the context of maintaining an advantageous transparency for large parts of the electromagnetic spectrum, for example in the range of 76 and 77 GHz, and the associated applicability as a coating for radar applications or for capacitive sensors, it can be advantageously further provided that the metallic material is present in the coating at less than 50% by weight, preferably less than 25% by weight, in particular less than 10% by weight. With increasing addition of metallic material, it is to be expected that the transparency of the coating decreases in large parts of the electromagnetic spectrum, which is disadvantageous for some depositions.

With a view to minimizing the differences between reflection minima and reflection maxima of the coating as effectively as possible, it can be advantageously provided that the coating has an average absorption coefficient k in the optical range of >2, preferably of >3, in particular of >4. Alternatively, instead of the mean absorption coefficient k in the optical range, the absorption coefficient k at a specific wavelength (for example 620 nm) could also be used. As already described above, high differences between reflection minima and reflection maxima of a coating layer lead to undesirable "glaring" color perceptions within the coating layer.

For possible depositions of the coating in question in radar technology, it is particularly advantageous if the coating is as transparent as possible in the frequency ranges used. Therefore, it can be advantageously provided that the coating has a transparency of >80%, preferably >90%, in particular >95%, in a frequency range between 76 and 77 GHz.

In order to be able to adjust the optical properties of a coating as specifically as possible, it can be advantageously provided that the semiconductor material is present in the form of a pure substance, the semiconductor material preferably being formed from silicon or germanium or selenium or gallium arsenide. With regard to increasing the flexibility with respect to the adaptation of the optical properties of a coating, in particular the adaptation of different optical properties of a coating, it may further be advantageous if the semiconductor material is present as a mixture of different semiconductor materials, wherein the semiconductor materials may preferably comprise silicon and/or germanium and/or selenium and/or gallium arsenide.

Likewise, with regard to the most targeted possible adaptation of the optical properties of a coating, it can be provided that the metallic material is present in the form of a pure substance, the metallic material preferably being formed from chromium or molybdenum or aluminum or zirconium. Moreover, with a view to increasing flexibility with respect to adaptation of the optical properties of the coating, it may be equally advantageous if the metallic material is present as a mixture of different metals, which metals may preferably comprise chromium and/or molybdenum and/or aluminum and/or zirconium.

Further advantages, features and details of the invention will be apparent from the following description, in which embodiments of the invention are described in detail with reference to the drawings. In this connection, the features mentioned in the claims and in the description may each be essential to the invention individually or in any combination.

Figure 1C:
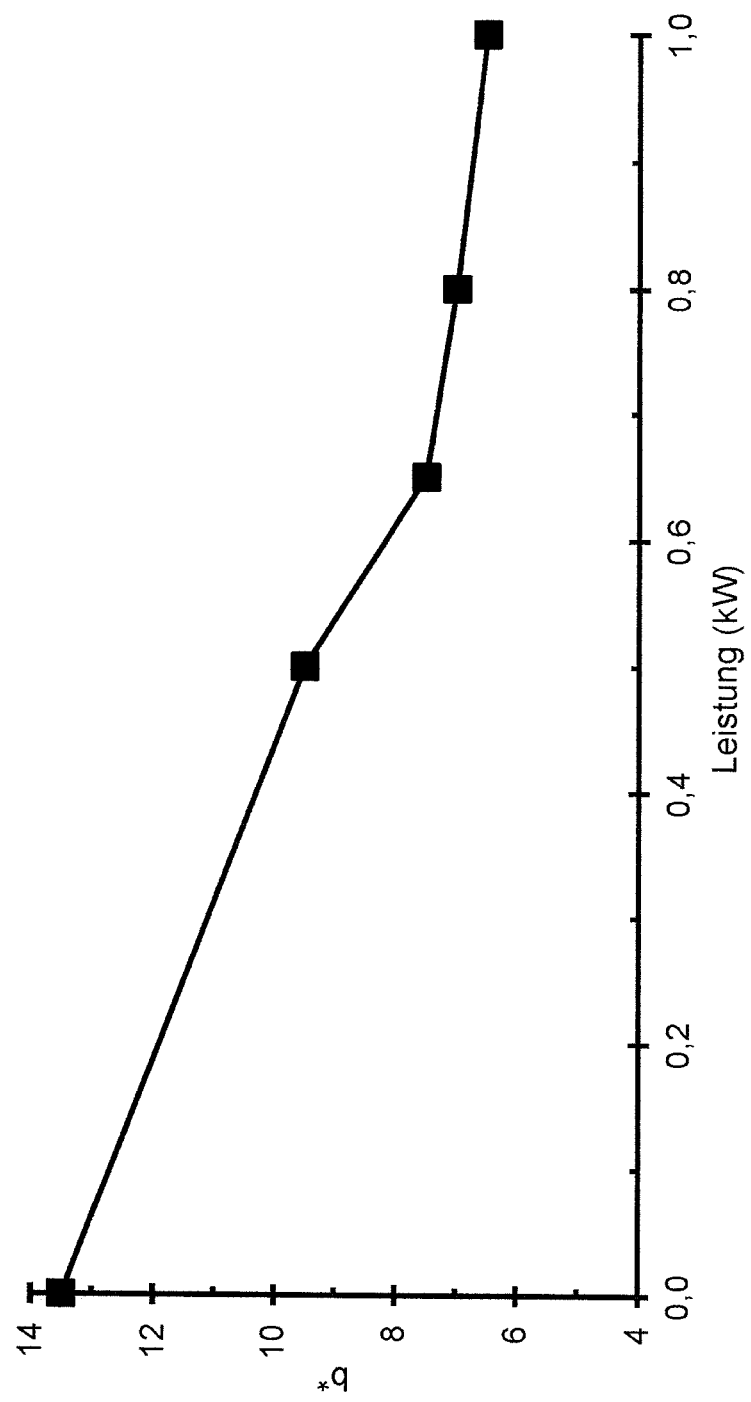
Figure 2:
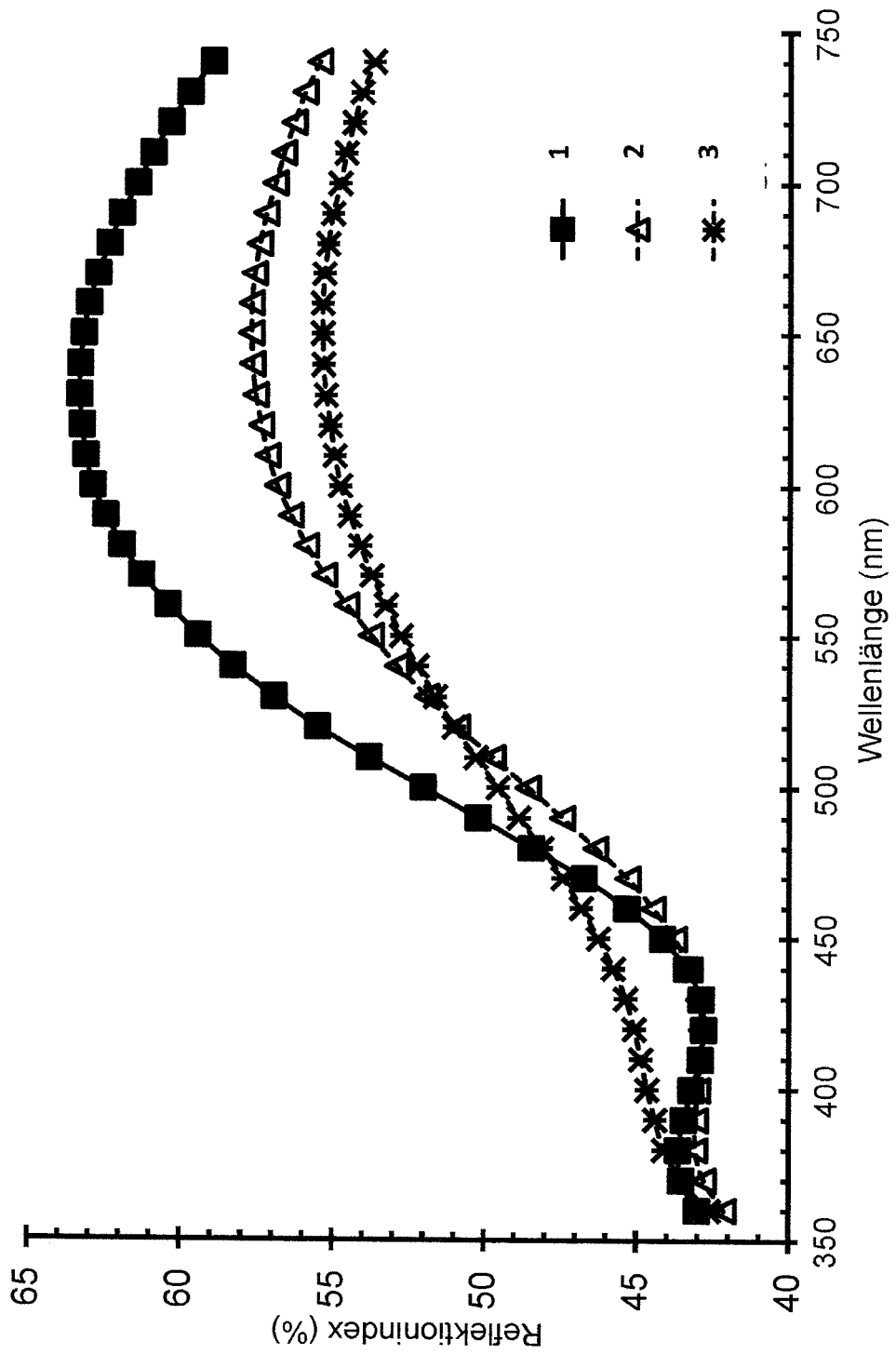
Figure 3:
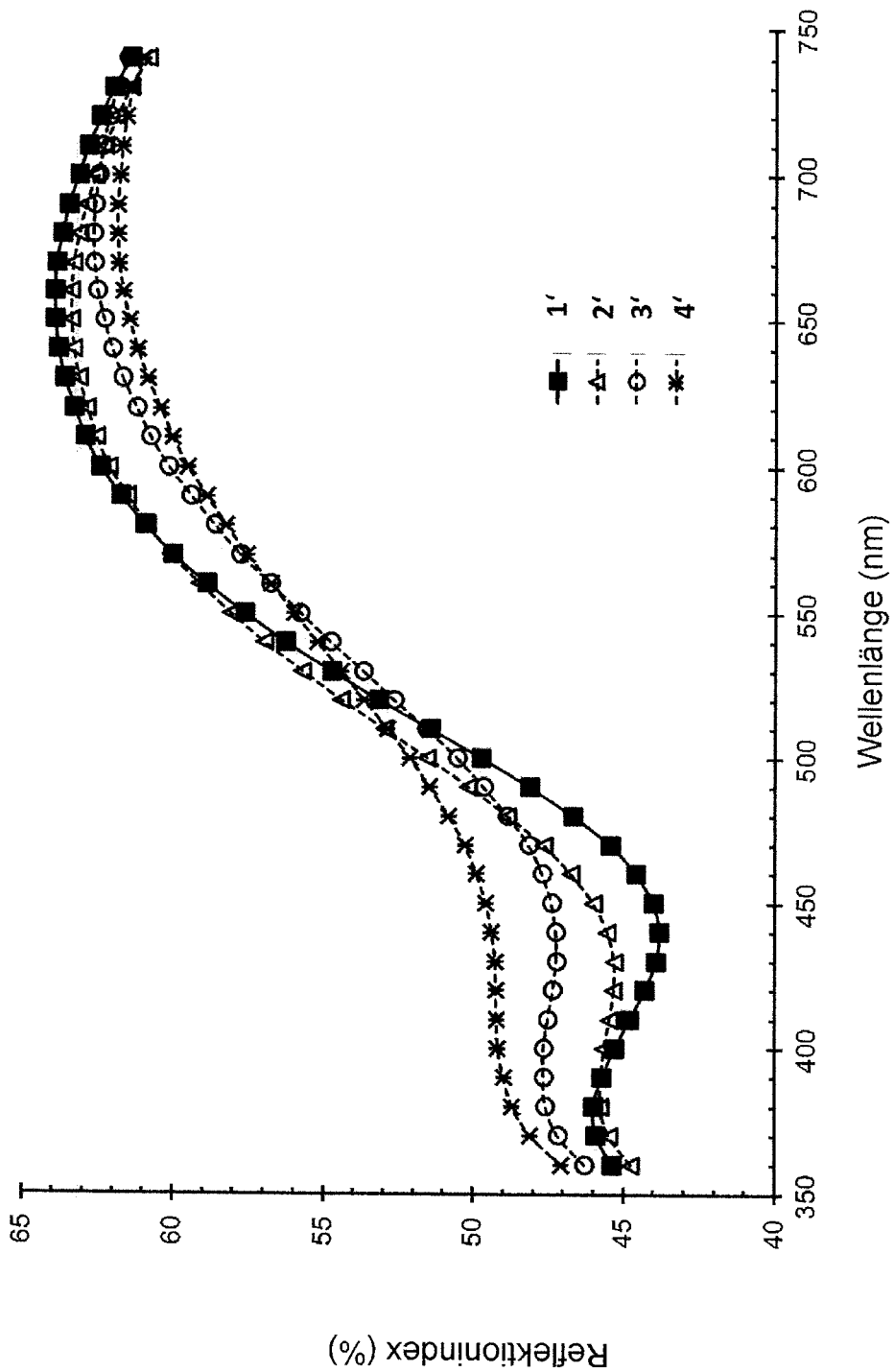
Figure 4:
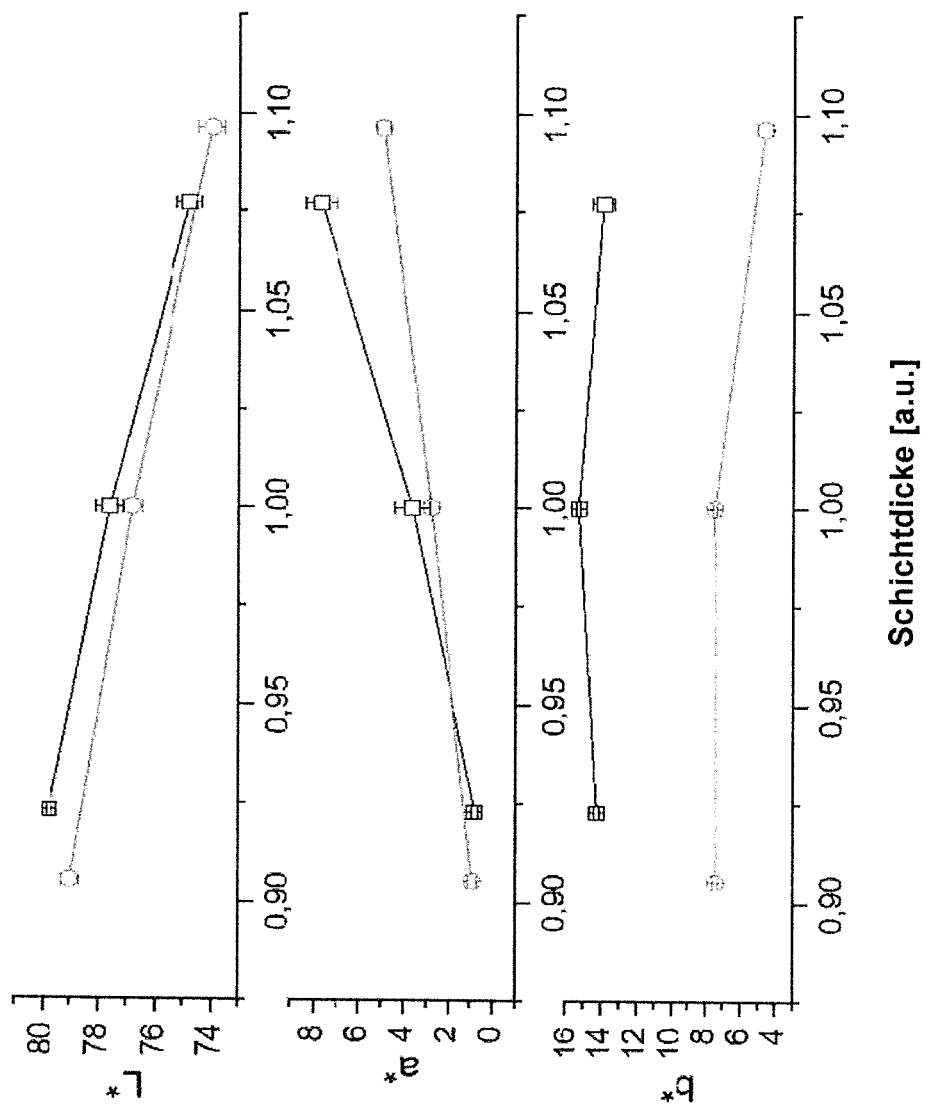
Figure 5:
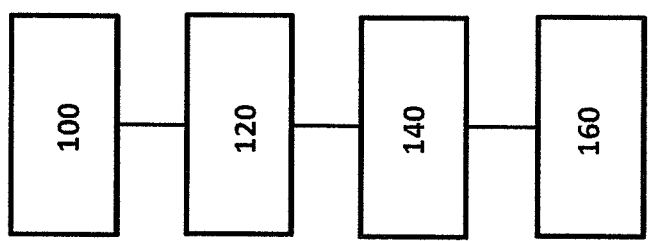

It show:

FIG. 1a-c a schematic representation of a plot of the L-value (a), the a-value (b) and the b-value (c) of an L*a*b color space as a function of the metal content of a coating according to the invention, FIG. 2 a schematic representation of a plot of the reflection index (%) of various coatings in the wavelength range 350 nm to 750 nm, FIG. 3 a schematic representation of a plot of the reflection index (%) of various coatings in the wavelength range 350 nm to 750 nm, FIG. 4 a schematic representation of a plot of the L-value (top), the a-value (middle) and the b-value (bottom) of an L*a*b color space as a function of the layer thickness of a coating according to the invention in accordance with a first embodiment and a reference measurement, FIG. 5 a schematic representation of the individual steps of a method according to the invention for producing a coating for a deposition to non-metallic surfaces.

FIGS. 1a-c show a schematic representation of a plot of the L-value (FIG. 1a), the a-value (FIG. 1b) and the b-value (FIG. 1c) of an L*a*b color space as a function of the metal content of a coating according to the invention.

As can be seen from FIGS. 1a-c, the L-, a- and b-values of the L*a*b color space vary specifically as a function of the composition of the coating according to the invention. The proportion of metal in the coating according to the invention is proportional to the evaporation power (in kW). Thus, the L-value of a coating according to the invention initially decreases with increasing metal content, before briefly increasing at a value of about 0.5 kW and then further decreasing with further addition of a metallic material. The a-value, on the other hand, increases steadily up to a value of about 0.5 kW, before falling steadily from a value of about 0.5 kW. The b-value, on the other hand, decreases steadily from a first addition of a metallic material.

On the basis of the depositions according to FIGS. 1a-1c, it can therefore be seen that the optical properties of the coating according to the invention can be varied in a targeted manner by selective admixing or deposition of metallic material.

FIG. 2 shows a schematic representation of a plot of the reflection index (%) of various coatings in the wavelength range 350 nm to 750 nm. Coating 1 consists here of pure silicon, whereas coating 2 is a coating according to the invention with silicon and a low chromium content, and coating 3 is a coating according to the invention with silicon and a high chromium content.

As can be seen from FIG. 2, the reflection index in the optical range from 350 to 750 nm is clearly dependent on the composition of the coating layer. Thus, although the course of the reflection index of the three coatings 1-3 is basically similar in the wavelength range 350 nm to 750 nm, coating layer 1 (pure Si) shows the highest reflection index between 500 and 750 nm. Coating 2 (Si+little Cr), on the other hand, exhibits a significantly lower reflection index between 500 and 750 nm, but this is still greater than that of coating 3 (Si+much Cr).

FIG. 3 shows a schematic representation of a plot of the reflection index (%) of different coatings in the wavelength range 350 nm to 750 nm, the coating 1' consists here of pure silicon, whereas the coating 2' is a coating according to the invention with silicon and high germanium content (semiconductor material+doped additional semiconductor material, (semiconductor material+doped additional semiconductor material which is different from the semiconductor material for the formation of a semiconductor material layer) and the coating 3' represents a coating according to the invention with silicon and medium germanium content and the coating 4' represents a coating with silicon and low germanium content.

As can be seen from FIG. 3, the reflection index in the optical range from 350 to 750 nm is clearly dependent on the composition of the coating layer. Thus, although the course of the reflection index of the four coatings 1'-4' is basically similar in the wavelength range 350 nm to 750 nm, coating layer 1' (pure Si) shows the highest reflection index between 500 and 750 nm. Coating 2' (Si+much Ge) shows a lower reflection index between 500 and 750 nm, but it is still greater than that of coatings 3' (Si+medium amount of Ge) and 4' (Si+small amount of Ge).

FIG. 4 shows a schematic representation of a plot of the L-value (top), the a-value (middle) and the b-value (bottom) of an L*a*b color space as a function of the layer thickness of a coating according to the invention (circle) in accordance with a first embodiment and a reference measurement (square).

As can be seen from FIG. 4, the reference measurements (pure Si) show in principle the same trend with regard to the L-, a- and b-values as the coating (Si+Cr), namely that the L-value decreases with increasing coating thickness, the a-value increases with increasing coating thickness and the b-value initially remains constant with increasing coating thickness and then decreases slightly. However, it can be clearly seen that the L- and a-values, in particular the b-values, are significantly higher for the pure semiconductor material and consequently achieve a partially undesirable garish color perception.

FIG. 5 shows a schematic representation of the individual steps of a method according to the invention for producing a coating for a deposition to non-metallic surfaces.

In this context, the method according to the present invention first comprises a first optional step of pretreating 100 the substrate surface in order to bring about stronger adhesion of the semiconductor material layer to the substrate. The pretreatment 100 can preferably comprise the deposition of an adhesive layer, wherein the adhesive layer can be formed in particular in the form of a lacquer layer.

Subsequently, according to the method according to the invention, a deposition 120 of a semiconductor material is carried out on a substrate to form a semiconductor material layer and a deposition 140 of metallic material is carried out, whereby the metallic material is introduced into the semiconductor material layer in a targeted manner to adapt the optical properties of the coating. The deposition 140 of the metallic material can take place simultaneously or also subsequently to the deposition 120 of the semiconductor material.

In order to integrate improved protection or additional properties into the coating in question, a protective layer can optionally be applied, whereby the protective layer can be formed in particular in the form of a lacquer layer or the like.

By means of the method according to the invention or the coating according to the invention, it is possible, in particular via a targeted introduction of a metallic material into a semiconductor layer, to generate a coating with an appealing metallic outer appearance that can be used in a variety of ways, in particular also for radar depositions or in the field of capacitive sensors, and whose appearance is at the same time largely independent of the viewing angle.

LIST OF REFERENCE SIGNS

100 Pretreating a substrate surface
120 Deposition of a semiconductor material
140 Deposition of a metallic material
160 Deposition of a protective coating

The invention claimed is:

1. A method for preparing a coating for a deposition to non-metallic surfaces comprising:
applying a semiconductor material to a substrate to form a semiconductor material layer,
simultaneous or subsequent deposition of a metallic material and optionally an additional semiconductor material, the metallic material or the additional semiconductor material being introduced into the semiconductor material layer in a targeted manner in order to adjust a reflectivity of the coating as a function of wavelength in at least one of the optical domain and the radar range, wherein at least the metallic material to be applied or an amount of metallic material to be applied or a deposition area of the metallic material to be applied is selected at least partly on the basis of the absorption coefficient k of the metallic material in an optical area.

2. The method according to claim 1, wherein the semiconductor material is added in the form of a pure substance.

3. The method according to claim 1, the metallic material is added in the form of a pure substance.

4. The method according to claim 1, wherein at least the deposition of the semiconductor material or the deposition of the metallic material is carried out via a thermal treatment.

5. The method according to claim 1, wherein at least the amount of metallic material applied or proportion of metallic material applied in relation to the sum of semiconductor material and metallic material is effected at least via a variation of the treatment time or a variation of the treatment temperature.

6. The method according to claim 1, wherein the deposition of the semiconductor material to the substrate takes place at least partially simultaneously with the deposition of a portion of metallic material.

7. The method according to claim 1, wherein the deposition of the semiconductor material and the metallic material is carried out at least via a chemical or physical coating process.

8. The method according to claim 1, wherein a negative bias voltage is applied to the substrate to be coated during a deposition of the semiconductor material, the negative bias voltage being less than 200 V.

9. The method according to claim 1, wherein a shielding gas is used in a deposition of the semiconductor material.

10. The method according to claim 1, wherein before a semiconductor material is applied to a substrate, a pretreatment of the substrate surface is carried out in order to bring about stronger adhesion of the semiconductor material layer to the substrate.

11. The method according to claim 1, wherein after a deposition of a semiconductor material and a simultaneous or subsequent deposition of metallic material, a final deposition of a protective layer takes place.

12. The method according to claim 1, wherein the semiconductor material layer has a portion of the metallic material integrated within the semiconductor material layer.

13. The method according to claim 1, wherein the coating is in the form of a monolayer.

14. The method according to claim 1, wherein the coating has a layer thickness of less than 120 nm.

15. The method according to claim 1, wherein the coating has a layer thickness of between 20 and 120 nm.

16. The method according to claim 1, wherein less than 50% by weight of the metallic material is present in the coating.

17. The method according to claim 1, wherein the coating has an average absorption coefficient k in the optical range of >2.

18. The method according to claim 1, wherein the coating has a transparency of >80% in a frequency range between 76 and 77 GHz.

19. A method for preparing a coating for a deposition to non-metallic surfaces comprising:
applying a semiconductor material to a substrate to form a semiconductor material layer,
simultaneous or subsequent deposition of a metallic material and optionally an additional semiconductor material, the metallic material or the additional semiconductor material being introduced into the semiconductor material layer in a targeted manner in order to adjust a viewing angle dependence of the external appearance, wherein at least the metallic material to be applied or an amount of metallic material to be applied or a deposition area of the metallic material to be applied is selected at least partly on the basis of the absorption coefficient k of the metallic material in an optical area.

* * * * *